(12) United States Patent
Fuerniss et al.

(10) Patent No.: US 6,521,844 B1
(45) Date of Patent: Feb. 18, 2003

(54) THROUGH HOLE IN A PHOTOIMAGEABLE DIELECTRIC STRUCTURE WITH WIRED AND UNCURED DIELECTRIC

(75) Inventors: Stephen J. Fuerniss, deceased, late of Endicott, NY (US), by Joan Cangelosi, administrator; Gary Johansson, Hockessin, DE (US); Ross W. Keesler, Endicott, NY (US); John M. Lauffer, Waverly, NY (US); Voya R. Markovich, Endwell, NY (US); Peter A. Moschak, Whitney Point, NY (US); David J. Russell, Apalachin, NY (US); William E. Wilson, Waverly, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/430,076

(22) Filed: Oct. 29, 1999

(51) Int. Cl.⁷ ................................. H05K 1/00
(52) U.S. Cl. ................... 174/258; 174/262; 174/264; 174/266
(58) Field of Search ................. 174/262, 263, 174/264, 265, 266, 52.4, 256, 258; 361/761, 762, 763, 764; 257/774

(56) References Cited

U.S. PATENT DOCUMENTS

| | | | |
|---|---|---|---|
| 3,873,756 A | * | 3/1975 | Gall et al. ................... 174/262 |
| 4,318,954 A | * | 3/1982 | Jensen ........................ 428/209 |
| 4,572,764 A | | 2/1986 | Fan |
| 4,791,248 A | * | 12/1988 | Oldenettel ................... 174/252 |
| 4,915,983 A | | 4/1990 | Lake et al. |
| 5,129,142 A | | 7/1992 | Bindra et al. |
| 5,258,094 A | | 11/1993 | Furui et al. |
| 5,643,657 A | | 7/1997 | Dueber et al. |
| 5,685,070 A | | 11/1997 | Alpaugh et al. |
| 5,699,613 A | | 12/1997 | Chong et al. |
| 5,758,413 A | | 6/1998 | Chong et al. |
| 6,239,386 B1 | * | 5/2001 | DiSlefano et al. .......... 174/262 |

OTHER PUBLICATIONS

"High Performance Carrier Technology: Materials and Fabrication", by Light et al, 1993 International Electronics Packaging Conference, San Diego, California, vol. One.

"High Performance Carrier Technology", by Heck et al, 1993 International Electronics Packaging Conference, San Diego California, vol. One.

"Process Considerations in the Fabrication of Teflon Printed Circuit Boards", by Light et al, 1994 Proceedings, 44 Electronic Components & Technology Conference, 5/94.

Multi Layer Substrate with Low Coeffcent of Thermal Expansion, Nakamura et al., 2000 International Symposium on Microelect, pp. 235–240.

* cited by examiner

*Primary Examiner*—Kamand Cuneo
(74) *Attorney, Agent, or Firm*—Schmeiser, Olsen & Watts; Lawrence R. Fraley

(57) ABSTRACT

An electronic structure. The electronic structure comprises a layer. The layer includes: a cylindrical volume; a fully cured annular volume of a photoimageable dielectric (PID) material circumscribing the cylindrical volume; and a partially cured remaining volume of the PID material circumscribing the annular volume. The cylindrical volume may include a via. The structure can include a power plane.

11 Claims, 12 Drawing Sheets

THROUGH HOLE IN A PHOTOIMAGEABLE DIELECTRIC STRUCTURE WITH WIRED AND UNCURED DIELECTRIC

BACKGROUND OF THE INVENTION

1. Technical Field

The present invention relates to a method of forming a through hole in a layered structure that includes a layer having a photoimageable dielectric material.

2. Related Art

An electrical structure, such as a printed circuit board, typically includes a stack of cores. A core is a dielectric layer with metalization on either side. Such an electrical structure may include cores, such as 2 to 15 cores, laminated together with a layer of dielectric material between each pair of cores. Following lamination, a though hole may be formed through the thickness of the overall structure, such as by mechanical drilling or laser ablation, and then plated with metal to facilitate electrical coupling between various layers of the structure. Alternatively, the through hole may be formed incrementally by forming a via in a layer after the layer has been laminated onto the stack, such that the via thus formed is properly registered over the corresponding via in the preceding layer of the stack. Thus, the through hole may formed in either in one step or in a sequence of steps.

Drilling a through hole through a layered structure, such as by mechanical or laser drilling, is a very expensive step of the overall process and is often the most costly step. Moreover, it is not unusual for some of such drilled holes to generate a defect in the structure that necessitates discarding the structure, resulting in a yield loss coupled with loss of processing time. For example, the drilling may cause an unwanted pinhole or crack to form such that subsequent metallic plating of the structure results in plating of the pinhole which becomes a source of unwanted electrical shorting between conductive portions of the structure. Even greater costs may result from using the sequential method because a yield loss will occur at each step in which a via is formed with the cumulative cost growing nonlinearly as more layers are added.

A less costly method is needed to form a through hole in a layered dielectric structure.

SUMMARY OF THE INVENTION

The present invention provides a method for forming an electronic structure, comprising the steps of:

providing a layer that includes: a cylindrical volume of a photoimageable dielectric (PID) material, an annular volume of the PID material circumscribing the cylindrical volume, and a remaining volume of the PID material circumscribing the annular volume;

photolithograhically exposing the layer to radiation;

fully curing the annular volume by said radiation;

partially curing the remaining volume by said radiation; and preventing curing of the cylindrical volume, wherein the PID material in the cylindrical volume remains uncured.

The present invention provides a method for forming an electronic structure having a through hole, comprising the steps of:

forming a layer that includes a via and an internal power plane having a hole therethrough, wherein a fully cured volume of a photoimageable dielectric (PID) material circumscribes the via, wherein a partially cured remaining volume of the PID material circumscribes the fully cured volume, and wherein a perimeter of the hole in the power plane surrounds the fully cured volume and circumscribes a portion of the remaining volume;

forming a first dielectric layer having a first via, wherein a cross-sectional area and shape of the first via is about the same as a cross-sectional area and shape of the via;

forming a second dielectric layer having a second via, wherein a cross-sectional area and shape of the second via is about the same as the cross-sectional area and shape of the via;

forming a layered stack, wherein the layer is nonadhesively sandwiched between the first dielectric layer and the second dielectric layer, and wherein the via is registered between the first via and the second via; and fully curing the remaining volume, wherein the PID material of the partially cured volume is prevented by the fully cured volume from entering the via, wherein the layer becomes adhesively sandwiched between the first dielectric layer and the second dielectric layer, and wherein the electronic structure is formed such that the through hole comprises the first via, the via, and the second via.

The present invention provides a layer, comprising:

a cylindrical volume;

a fully cured annular volume of a photoimageable dielectric (PID) material circumscribing the cylindrical volume; and a partially cured remaining volume of the PID material circumscribing the annular volume.

The present invention provides an electronic structure, comprising:

a layer that includes: a via, a fully cured volume of a photoimageable dielectric (PID) material circumscribing the via, and a partially cured remaining volume of the PID material circumscribing the fully cured volume; and a power plane between a first surface of the layer and a second surface of the layer, wherein the power plane includes a hole therethrough, wherein a perimeter of the hole in the power plane surrounds the fully cured volume and circumscribes a portion of the remaining volume.

The present invention provides a method forming an electronic structure, comprising the steps of:

providing a layer that includes:
  a cylindrical volume of a photoimageable dielectric (PID) material,
  a first annular volume of the PID material circumscribing the cylindrical volume,
  a second annular volume of the PID material circumscribing the first annular volume,
  a remaining volume of the PID material circumscribing the second annular volume, and
  a power plane between a first surface of the layer and a second surface of the layer, wherein the power plane includes a hole therethrough, and wherein a perimeter of the hole in the power plane circumscribes the second annular volume;

photolithograhically exposing the layer to radiation;

partially curing the first annular volume by said radiation;

fully curing the second annular volume by said radiation;

partially curing the remaining volume by said radiation; and preventing curing of the cylindrical volume.

The present invention provides an electronic structure, comprising:

a layer that includes: a via, a first partially cured volume of a photoimageable dielectric (PID) material circumscribing the via, a fully cured volume of the PID material circumscribing the first partially cured volume, and a second partially cured remaining volume of the PID material circumscribing the fully cured volume; and a power plane between a first surface of the layer and a second surface of the layer, wherein the power plane includes a hole therethrough, wherein a perimeter of the hole in the power plane circumscribes the fully cured volume.

The present invention advantageously forms a through hole in a layered structure having a layer that includes PID material, by a method which forms each layer and its via in isolation from the other layers, wherein a defect generated by formation of the via may result in discarding the layer without discarding the layered structure.

The present invention has the advantage of providing a fully cured annulus around a via within a layer of PID material, so that partially cured.PID material cannot move into the via when the layered structure that includes the layer is subject to pressurization and/or elevated temperature.

The present invention has the advantage of forming photovias, which is a less expensive process than that of forming laser-drilled vias.

The preceding advantages facilitate lower fabrication costs, reduced cycle time, and improved quality assurance. Thus, the present invention has the overall advantage of providing an inexpensive method of forming a through hole in a layered dielectric structure having PID material in at least one layer.

DETAILED DESCRIPTION OF THE INVENTION

Figure 1:
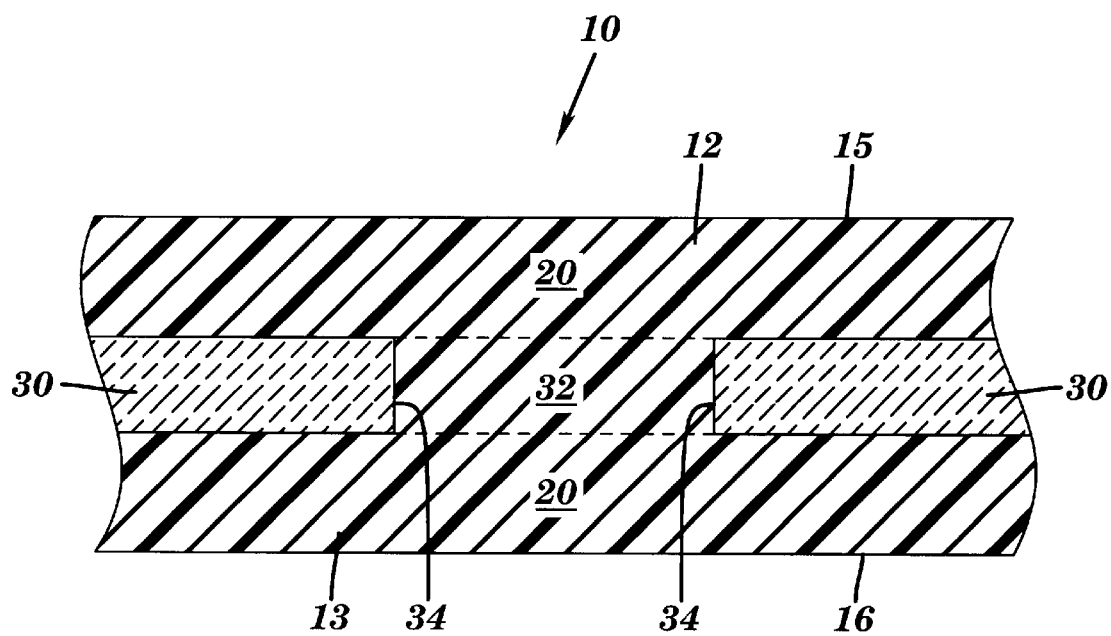
FIG. 1 depicts a front cross-sectional view of a layer that includes photoimageable dielectric (PID) material, in accordance with preferred embodiments of the present invention.

FIG. 1 illustrates a front cross-sectional view of a layer 10 that includes photoimageable dielectric (PID) material 20, in accordance with preferred embodiments the present invention. Any PID material known to one skilled in the art may be used in the resent invention, such as improved photoimagable cationically polymerizable epoxy based coating materials whose compositions are described in U.S. Pat. No. 5,026,624 (Day et al., Jun. 25, 1991) and U.S. Pat. No. 5,300,402 (Card, Jr. et al., Apr. 5, 1994). The PID material 20, if uncured, flows when subject to pressurization and/or elevated temperature. The propensity of the PID material 20 to flow diminishes as it undergoes a curing process. For this invention, a given specimen of PID material may exist in one of the following states of cure uncured, partially cured, and fully cured. A specimen of PID material is "uncured" if the specimen has experienced no curing or negligible curing. A specimen of PID material is "partially cured" if the specimen has been cured to an extent that it will flow or deform, so as to nonadhesively couple with a contacting dielectric layer when subject to atmospheric pressure at ambient temperature, and adhesively bond with the contacting dielectric layer under subsequent pressurization and/or elevated temperature. A dielectric material that has been partially cured in the preceding manner is known to one skilled in the art as B-staged material. A specimen of PID material is "fully cured" if the specimen has been cured to such an extent that the PID material will not substantially flow, or substantially deform, if subject to subsequent pressurization and/or elevated temperature. The magnitude of pressurization and/or elevated temperature needed to effectuate adhesive bonding depends on, inter alia, such factors as the degree of partial curing achieved prior to the pressurization and/or elevated temperature, the particular PID material that has been partially cured, and the roughness of the surface to which the partially cured PID material will be subsequently bonded. The elevated temperature(s) may be achieved in various ways such as with multiple heating cycles. Pressures in a range of about 100 psi to about 700 psi, coupled with elevated temperatures in a range of about 80° C. to about 250° C., have been found to be effective for full curing the B-staged materials.

For the present invention, partial curing is accomplished by limited exposure of the PID material to radiation, such as ultraviolet radiation, and may be improved by accompanying and/or following the radiation exposure with heating such as at a temperature in a range of about 100° C. to about 150° C. for a period of time between about 3 minutes and about 15 minutes. Also for the present invention, full curing is accomplished either by exposure to radiation such as ultraviolet radiation of sufficient intensity and time to effectuate full curing, or by it subjecting partially cured PID material to a combination of pressurization and temperature elevation. Partial curing and full curing by exposure of the PID material to radiation is differentiated by the amount of radiant energy absorbed by the PID material, which is determined by such variables as the energy flux F (in such units as milliwatts/cm$^2$) of the radiation passing through the PID material and the total time T of exposure to the radiation, or more particularly on the dose FT. The range of FT that distinguishes partial curing from full curing depends on the specific PID material used inasmuch as each different PID material has its own characteristic chemical response to the incident radiation. One skilled in the art may determine practical ranges of FT for effectuating either full curing or partial curing, without undue experimentation, by varying FT through control of F and T for individually cured PID samples, followed by testing to determine whether the cured PID samples undergo liquification and flow upon subsequent pressurization and exposure to elevated temperatures.

The layer 10 preferably includes a power plane 30 having a hole 32 therethrough. A power plane is a layer of metal, such as copper, having one or more holes. The hole 32 is bounded by its perimeter, which is the cylindrical surface 34 of the power plane 30. The hole 32 is filled with the PID material 20. Thus, the PID material 20 is continuously distributed from the upper portion 12 to the lower portion 13 of the layer 10. While FIG. 1 shows the power plane 30 as approximately equidistant from a surface 15 and a surface 16 of the layer 10, the power plane 30 may be located at any distance from the surface 15 and the surface 16. The power plane 30 is required for some embodiments and is optional for other embodiments. Unless otherwise stated, the power plane 30 is assumed to be present.

An important characteristic of PID material is that negatively acting PID material, if not exposed to the radiation that it is sensitive to such as ultraviolet radiation, may be chemically developed away by any method known to one of ordinary skill in the art. Note that if the PID material is positively acting, the PID material actually exposed to the radiation would be developed away, which would necessitate an inversion of the masking schemes described herein in which portions of a given mask shown and described herein as opaque would be instead transparent and portions of the given mask shown and described herein as transparent would be instead opaque. The specific method and the chemicals that may be used for developing away the PID material, including wet chemicals and dry chemicals, depends on the chemical composition of the PID material. In contrast, radiation exposure of PID material causes chemical cross-linking reactions in the PID material, which renders the PID material resistant to being chemically washed away by a developer solution. Thus, photovias may be formed in the layer 10 by photolithographic masking schemes that prevent the radiation from reaching those volumes of the layer 10 in which photovias are to be formed, but which allow radiation to interact with the other volumetric portions of the layer 10 which may be subsequently exposed to the developer solution. The present invention includes, inter alia, four such photolithographic embodiments, which are described infra herein.

Figure 2:
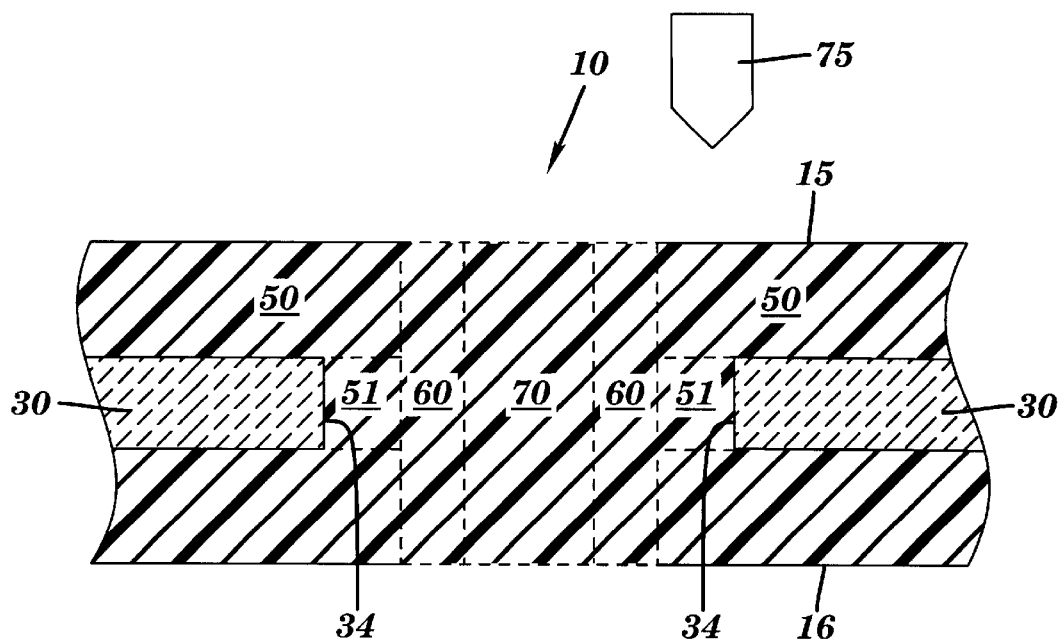
FIG. 2 depicts FIG. 1 with the layer divided into distinct volumes, including a cylindrical volume.
Figure 2A:
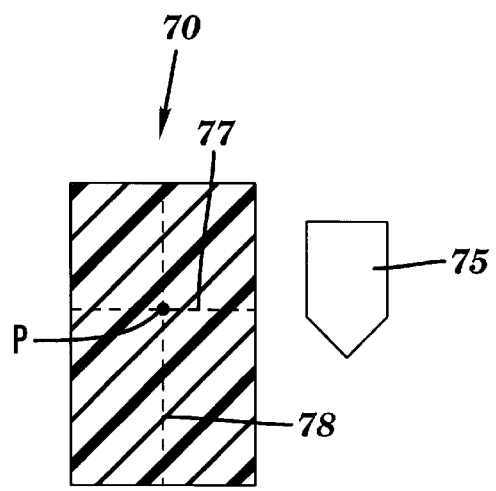
FIG. 2A depicts the axial structure of the cylindrical volume of FIG. 2.

FIG. 2 illustrates FIG. 1, wherein the space of the PID material 20 is divided into distinct volumes a cylindrical volume 70, an annular volume 60 circumscribing the cylindrical volume 70, and a remaining volume 50 circumscribing the annular volume 60. Definitionally, circumscribing includes surrounding and contacting. Also definitionally, a cylindrical volume is a three-dimensional volumetric shape having an axis therethrough such that a cross section of the cylindrical volume has a shape and area that are each invariant to position along the axis. FIG. 2A illustrates the axial structure of the cylindrical volume 70, wherein the cross section 77 of the cylindrical volume 70 is invariant to a position P of the cross section 77 in the direction 75 along the axis 78 of the cylindrical volume 70. The direction 75 also appears in FIG. 2 to clarify the orientation of the cylindrical volume 70 in FIG. 2A relative to the layer 10 in FIG. 2. While the shape of the cross section, such as the cross section 77 of FIG. 2A, of a cylindrical volume may be that of a circle, the shape may also be that of, inter alia, an ellipse or a square.

Returning to FIG. 2, the remaining volume 50 includes the portion 51, which is a volume between the power plane 30 and the annular volume 60. As the portion 51 of the remaining volume 50 diminishes in size and approaches a null (i.e., zero) volume, the portion 51 disappears such that the power plane 30 approaches circumscribing the annular volume 60. This limiting case is an optional form of the first and second embodiments of the present invention, whereas this limiting case is required for the third and fourth embodiments of the present invention.

Figure 3:
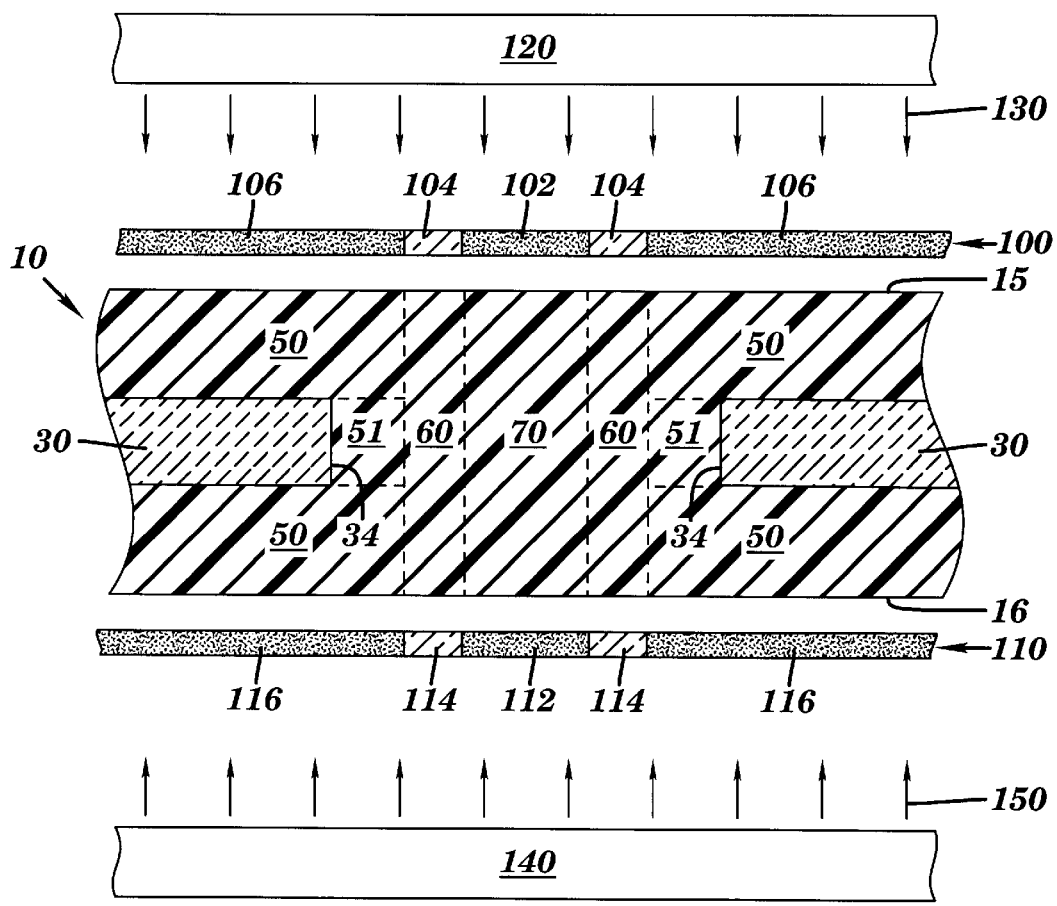
FIG. 3 depicts the layer of FIG. 2 showing a first photolithographic masking and exposure, in accordance with a first preferred embodiment of the present invention.

The first preferred embodiment of the present invention utilizes two masking schemes in succession. FIG. 3 illustrates FIG. 2 showing a first photolithographic masking and exposure, in accordance with the first preferred embodiment of the present invention. In FIG. 3, a radiation source 120 directs radiation 130, such as ultraviolet radiation, of energy flux F, for a time duration $T_1$ through a mask 100 located over the surface 15 of the layer 10 and then through the layer 10. In relation to the radiation 130, the mask 100 includes an opaque portion 102 over the cylindrical volume 70, a transparent portion 104 over the annular volume 60, and an opaque portion 106 over the remaining volume 50. Definitionally, a material is opaque or transparent if opaque or transparent, respectively, to an incident radiation. Thus, the opaque portion 102 and the transparent portion 104 are respectively opaque and transparent to the radiation 130. The radiation source 140 directs radiation 150, such as ultraviolet radiation, of energy flux $F_2$ for a time duration $T_2$ through a mask 110 located over the surface 16 of the layer 10 and then through the layer 10. In relation to the radiation 150, the mask 110 includes an opaque portion 112 over the cylindrical volume 70, a transparent portion 114 over the annular volume 60, and an opaque portion 116 over the remaining volume 50. $F_1$ $T_1$ and $F_2$ $T_2$ are preferentially about equal and should not differ by more than about 10%. The radiation source 120 may be operated before, after, or concurrent with the radiation source 140. Alternatively, either the radiation source 120 or the radiation source 140 may be omitted since the annular volume 60 can be accessed by either the radiation 130 or the radiation 150, regardless of whether the power plane 30 is present or absent. The energy absorbed by the annular volume 60 from the radiation 130 and/or the radiation 150 should be high enough to fully cure the annular volume 60, or high enough to initiate a full cure of the annular volume 60 followed by heating to effectuate the full cure of the annular volume 60 if the radiation is accompanied with, or followed by, heating. This necessitates that $F_1T_1+F_2T_2$ be of a sufficiently high magnitude that can be determined without undue experimentation, as explained supra.

Figure 4:
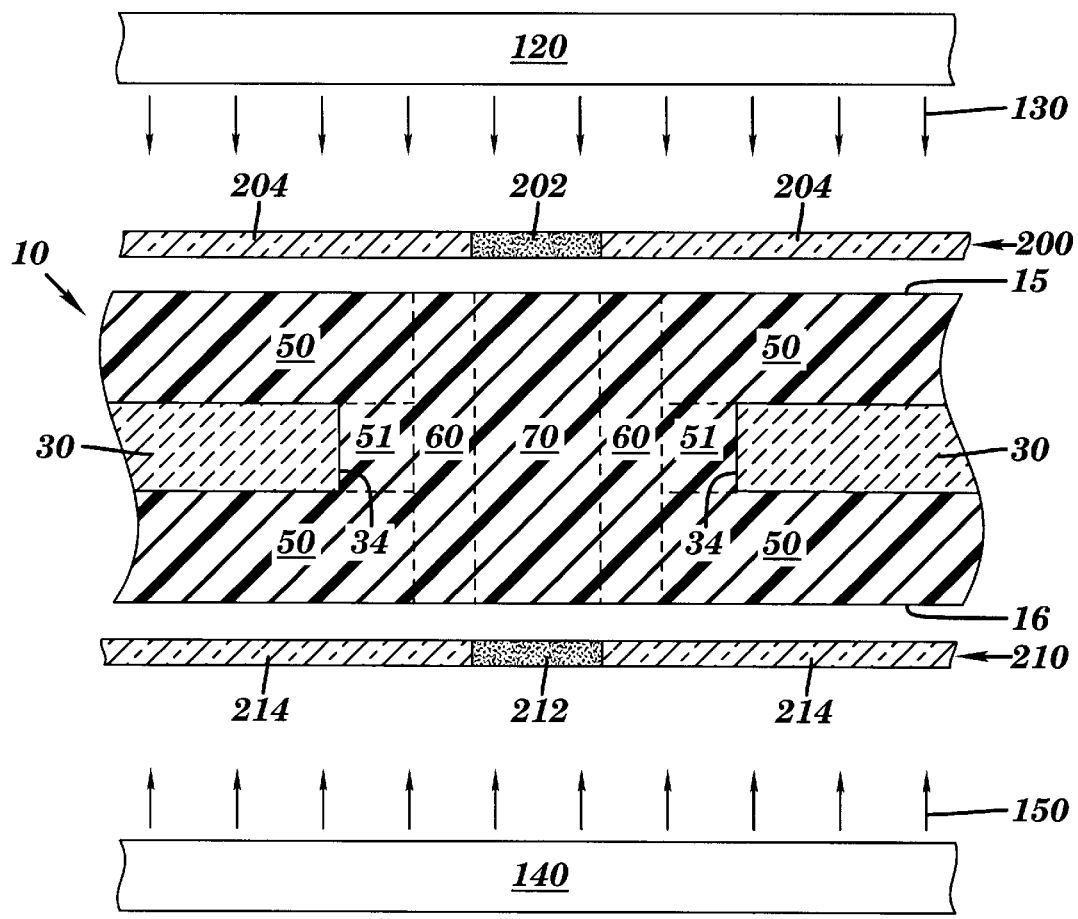
FIG. 4 depicts the layer of FIG. 2 showing a second photolithographic masking and exposure, in accordance with the first preferred embodiment of the present invention.

FIG. 4 illustrates FIG. 2 showing a second photolithographic masking and exposure, in accordance with the first preferred embodiment. In FIG. 4, the radiation source 120 directs radiation 130, such as ultraviolet radiation, of energy flux $F_3$ for a time duration $T_3$ through a mask 200 located over the surface 15 of the layer 10 and then through the layer 10. In relation to the radiation 130, the mask 100 includes an opaque portion 202 over the cylindrical volume 70, and a transparent portion 204 over the annular volume 60 and over the remaining volume 50.

With the power plane 30 present, the radiation 130 cannot access a portion of the remaining volume 50 situated between the power plane 30 and the surface 16 of the layer 10, so that the radiation source 140 must be used. The radiation source 140 directs radiation 150 of energy flux $F_4$ for a time duration $T_4$, such as ultraviolet radiation, through a mask 210 located over the surface 16 of the layer 10 and then through the layer 10. In relation to the radiation 150, the mask 210 includes an opaque portion 212 over the cylindrical volume 70, and a transparent portion 214 over the annular volume 60 and over the remaining volume 50. $F_3 T_3$ and $F_4 T_4$ are preferentially about equal and should not differ by more than about 10%. The radiation source 120 may be operated before, after, or concurrent with the radiation source 140. If the power plane 30 is absent, the radiation source 140 and associated radiation 150 are not required and may be omitted. The energy absorbed by the remaining volume 50 from the radiation 130 and/or the radiation 150 should be bounded ;so to partially cure, but not fully cure, the remaining volume 50. This necessitates that $F_3T_3$ and $F_4T_4$ be of a sufficiently low magnitude that can be determined without undue experimentation, as explained supra.

Figure 6:
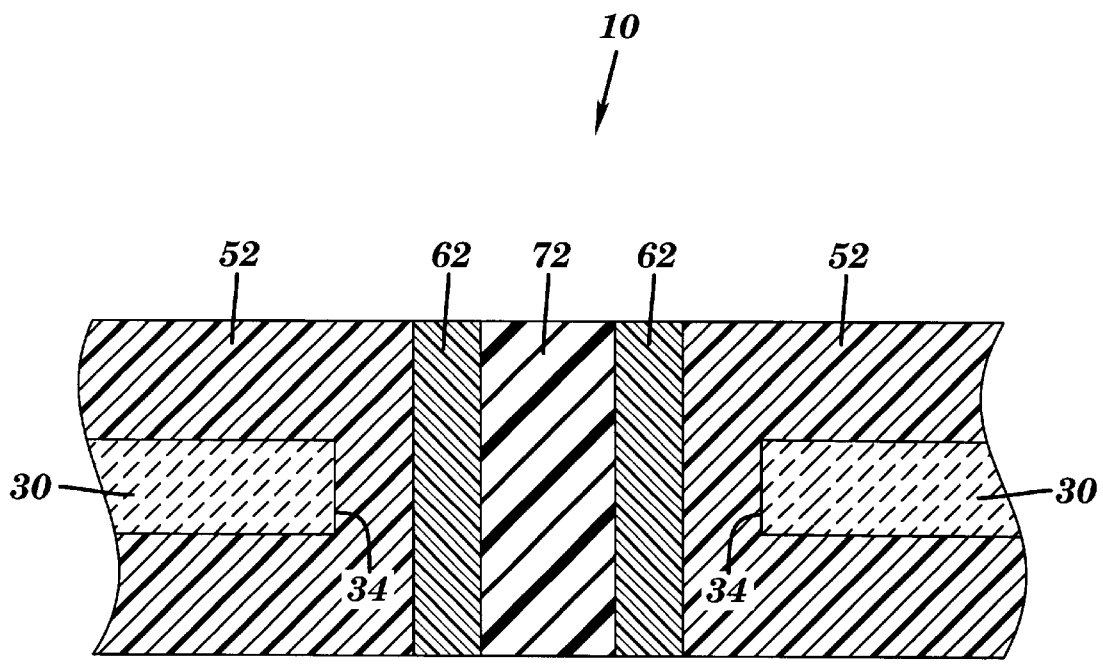
FIG. 6 depicts the layer of FIG. 2 after the photo lithographic masking and exposure shown in the first preferred embodiment of FIGS. 3 and 4, or in the second preferred embodiment of FIG. 5.
Figure 11:
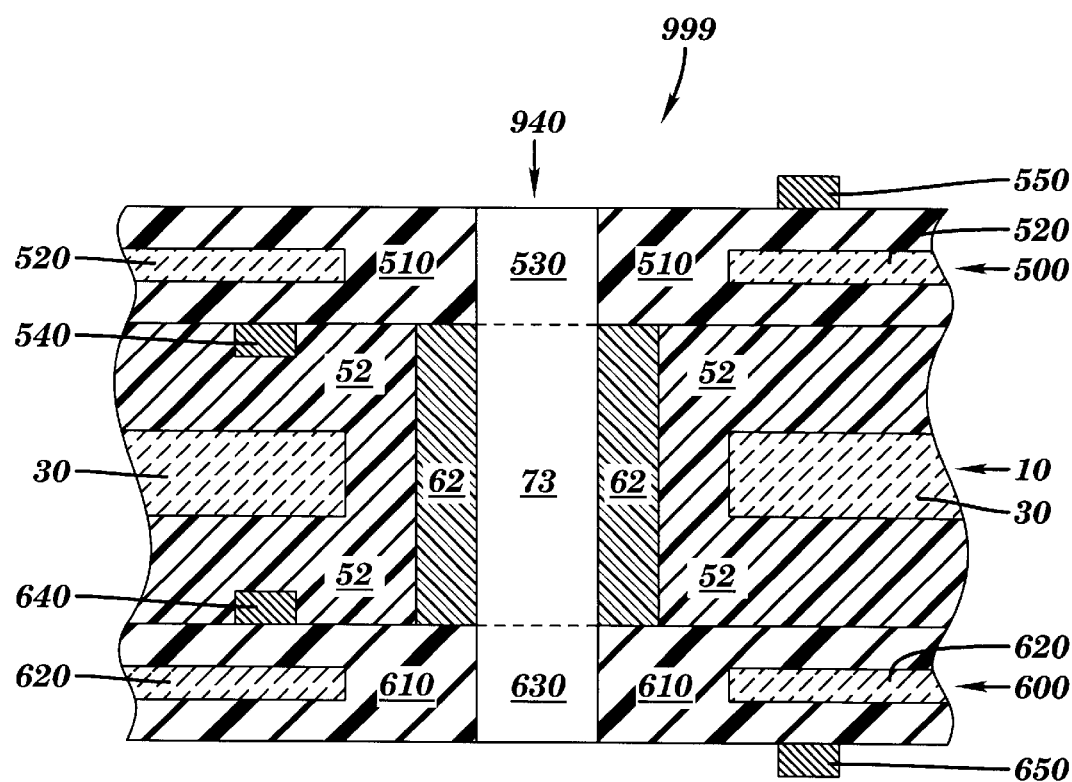
FIG. 11 depicts FIG. 6 after the photolithographically masked and exposed layer of FIG. 6 is sandwiched between two 2S/1P layers to form a layered stack.

For the first preferred embodiment, the first photolithographic masking and exposure (see FIG. 3) may be executed either before or after the second photolithographic masking and exposure (see FIG. 4). FIG. 6 shows an appearance of the layer 10 after execution of the first photolithographic masking and exposure and the second photolithographic masking and exposure. In FIG. 6, the cylindrical volume 70 is represented as an uncured volume 72, the annular volume 60 has become a fully cured volume 62, and the remaining volume 50 has become a partially cured volume 52. The uncured volume 72 is a consequence of the opaque portion 102, 112, 202, and 212 of the masks 100, 110, 200, and 210, respectively. The uncured volume 72 may be chemically developed away to form a via. For example, FIG. 11 shows the via 73 which results from a developing away of the PID material in the uncured volume 72 of FIG. 6.

Figure 5:
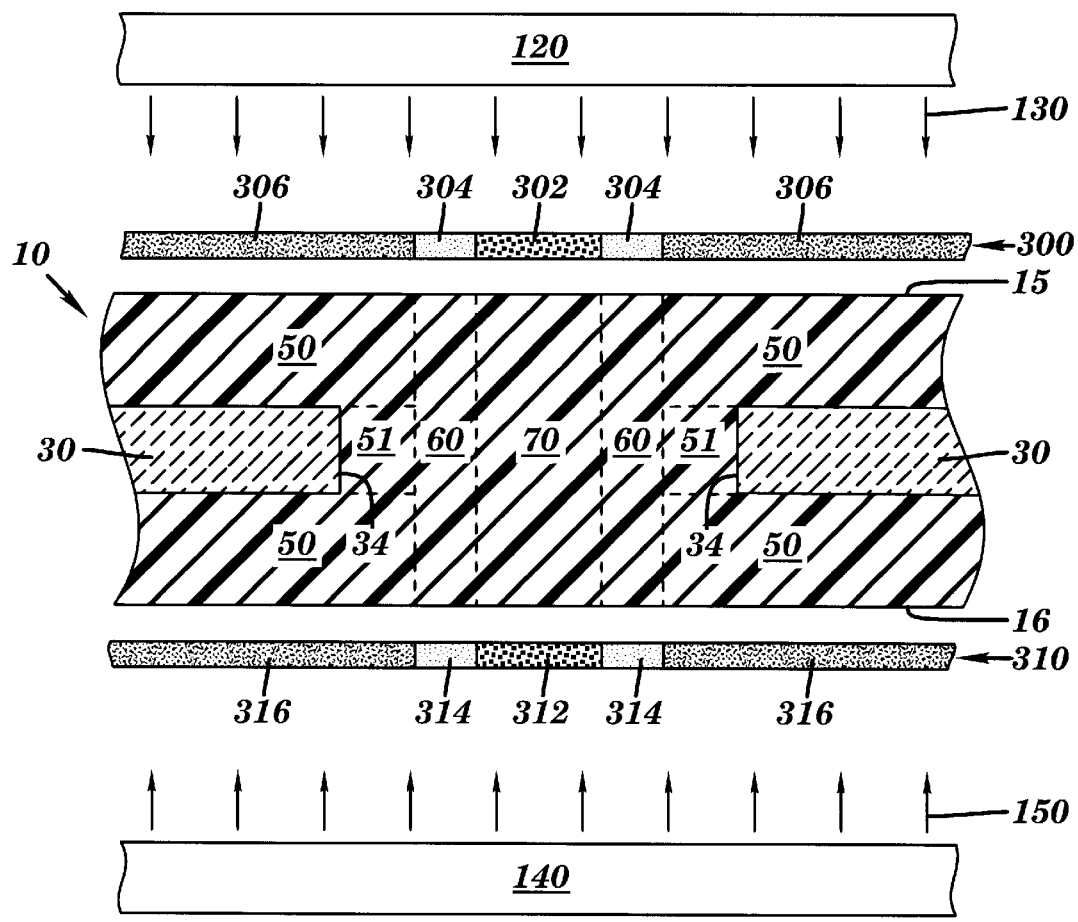
FIG. 5 depicts the layer of FIG. 2 showing a photolithographic masking and exposure, in accordance with a second preferred embodiment of the present invention.

FIG. 5 illustrates the layer of FIG. 2 showing a photolithographic masking and exposure, in accordance with the second preferred embodiment of the present invention. In FIG. 5, the radiation source 120 directs radiation 130, such as ultraviolet radiation, of energy flux $F_5$ for a time duration $T_5$ through a mask 300 located over the surface 15 of the layer 10 and then through the layer 10. In relation to the radiation 130, the mask 300 includes a portion 302 having an optical density $D_1$ over the cylindrical volume 70, a portion 304 having an optical density $D_2$ over the annular volume 60, and a portion 306 having an optical density $D_3$ over the remaining volume 50, wherein $D_1 > D_3 > D_2$. Optical density, which is defined as $-\log_{10}$ of the transmissivity, relates to a fraction of incident radiation 130 transmitted through the mask 300; i.e., the fraction of radiation 130 transmitted through a given portion of the mask 300 decreases as the optical density of the given portion increases. A purely transparent material has an optical density of zero, while a purely opaque material has an optical density of infinity.

With the power plane 30 present, the radiation 130 cannot access a portion of the remaining volume 50 situated between the power plane 30 and the surface 16 of the layer 10, so that the radiation source 140 must be used. The radiation source 140 directs radiation 150 of energy flux $F_6$ for a time duration $T_6$, such as ultraviolet radiation, through a mask 310 located over the surface 16 of the layer 10 and then through the layer 10. In relation to the radiation 150, the mask 310 includes a portion 312 having an optical density $D_4$ over the cylindrical volume 70, a portion 314 having an optical density $D_5$ over the annular volume 60, and a portion 316 having an optical density $D_6$ over the remaining volume 50, wherein $D_4 > D_6 > D_5$. $F_5 T_5$ and $F_6 T_6$ are preferentially about equal and should not differ by more than about 10%. If the power plane 30 is absent, the radiation source 140 and associated radiation 150 are unnecessary and may be omitted.

For given values of $F_3T_3$ and $F_4T_4$ associated with the radiation 130 and the radiation 150, respectively, the optical densities $D_1$ and $D_4$ should be sufficiently high that the cylindrical volume 70 remains uncured, the optical densities $D_2$ and $D_5$ should be sufficiently low that the annular volume 60 becomes fully cured (or low enough to initiate a full cure of the annular volume 60 followed by heating to effectuate the full cure of the annular volume 60 if the radiation is accompanied with, or followed by, heating), and the optical densities $D_3$ and $D_6$ should be in a range that ensures partial curing and prevents full curing. For given values of $F_3T_3$ and $F_4T_4$, one skilled in the art may determine practical values of $D_1$, $D_2$, $D_3$, $D_4$, $D_5$, and $D_6$ without undue experimentation by parametrically varying $D_1$, $D_2$, $D_3$, $D_4$, $D_5$ and $D_6$ until the aforementioned curing configuration of the layer 10 is achieved. Alternatively, one skilled in the art may use his or her experience to estimate practical values of $D_1$, $D_2$, $D_3$, $D_4$, $D_5$, and $D_6$, and then, without undue experimentation, parametrically vary $F_3T_3$ and $F_4T_4$ until the aforementioned curing configuration of the layer 10 is achieved. In accordance with the preceding methodology, $D_1$, $D_2$, $D_3$, $D_4$, $D_5$, and $D_6$ may be adjusted such that the portion 302 of the mask 300 is opaque over the cylindrical volume 70, the portion 304 of the mask 300 is transparent over the annular volume 60, the portion 306 of the mask 300 is partially transparent over the remaining volume 50, the portion 312 of the mask 310 is opaque over the cylindrical volume 70, the portion 314 of the mask 310 is transparent over the annular volume 60, and the portion 316 of the mask 310 is partially transparent over the remaining volume 50. A portion of a mask is partially transparent if the portion of the mask transmits a portion of the total incident radiative flux that partially cures a portion of the layer 10 that is exposed to the portion of the radiative flux.

FIG. 6 depicts the layer 10 of FIG. 2 after the photo lithographic masking and exposure shown in the first preferred embodiment of FIGS. 3 and 4, or in the second preferred embodiment of FIG. 5. FIG. 6, which was discussed supra in connection with the first embodiment, also shows the appearance of the layer 10 after execution of the photo lithographic masking and exposure for the second embodiment. As with the first embodiment, the cylindrical volume 70 is represented as an uncured volume 72, the annular volume 60 has become a fully cured volume 62, and the remaining volume 50 has become a partially cured volume 52. The uncured volume 72 may be chemically developed away to form a via. For example, FIG. 11 shows the via 73 which results from developing away the PID material in the uncured volume 72 of FIG. 6.

Figure 7:
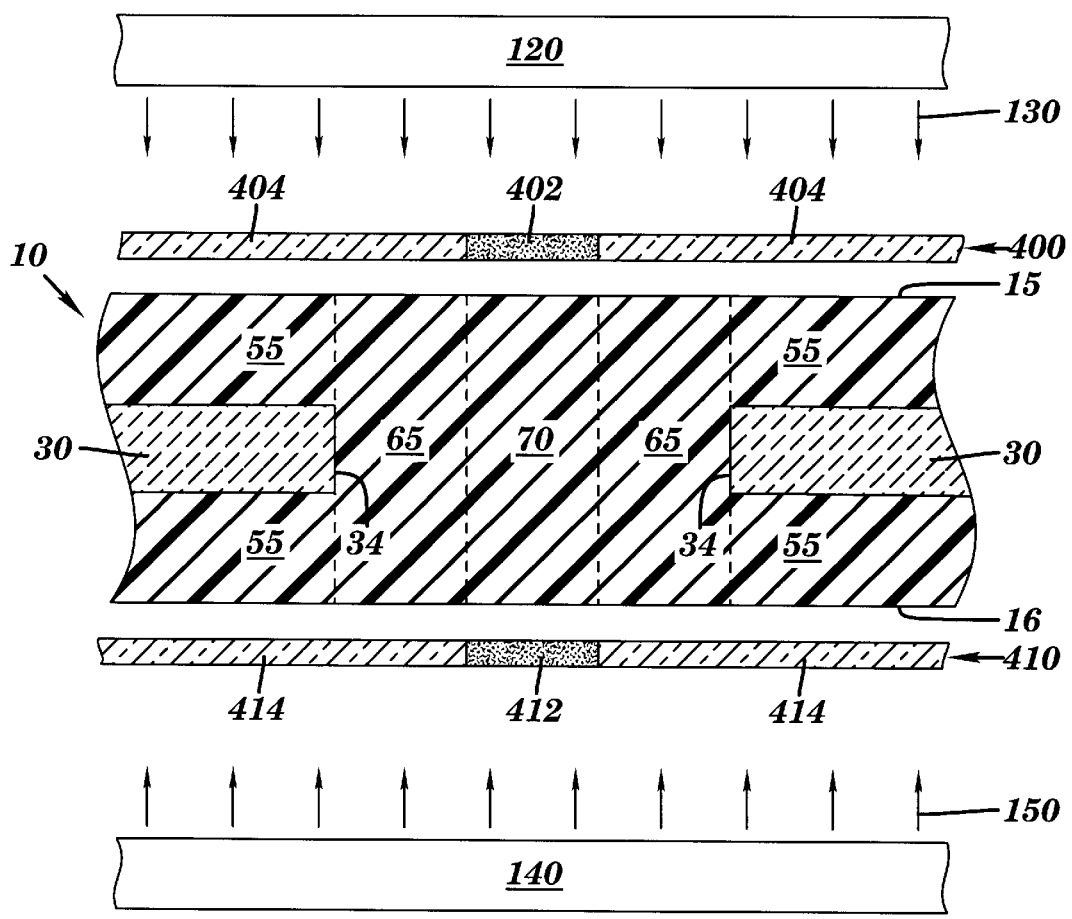
FIG. 7 depicts FIG. 2 with a modification of the volume structure and showing a photolithographic masking and exposure, in accordance with a third preferred embodiment of the present invention.

FIG. 7 illustrates FIG. 2 with a modification of the volume structure and showing a photolithographic masking and exposure, in accordance with a third preferred embodiment of the present invention. In FIG. 7, the portion 51 of the remaining volume 50 of FIG. 2 has been eliminated such that the remaining volume 50 has been replaced by the remaining volume 55, and an annular volume 60 has been replaced by the annular volume 65 such that the power plane 30 circumscribes the annular volume 65 at the cylindrical surface 34 of the power plane 30. In FIG. 7, the radiation source 120 directs radiation 130 of energy flux $F_7$ for a time duration $T_7$, such as ultraviolet radiation, through a mask 400 located over the surface 15 of the layer 10 and then through the layer 10. In relation to the radiation 130, the mask 400 includes an opaque portion 402 over the cylindrical volume 70, and a transparent portion 404 over the annular volume 65 and over the remaining volume 55.

Due to the presence of the power plane 30, the radiation 130 cannot access a portion of the remaining volume 55 situated between the power plane 30 and the surface 16 of the layer 10, so that the radiation source 140 must be used. The radiation source 140 directs radiation 150, such as ultraviolet radiation, of energy flux $F_8$ for a time duration $T_8$ through a mask 410 located over the surface 16 of the layer 10 and then through the layer 10. In relation to the radiation 150, the mask 410 includes an opaque portion 412 over the cylindrical volume 70, and a transparent portion 414 over the annular volume 65 and over the remaining volume 55. $F_7 T_7$ and $F_8 T_8$ are preferentially about equal and should not differ by more than about 10%. The radiation source 120 may be operated before, after, or concurrent with the radiation source 140. Note that the power plane 30 must be present in the third embodiment. The energy absorbed by the remaining volume 55 from the radiation 130 and the radiation 150 should be bounded so as to partially cure, but not fully cure, the remaining volume 55. This necessitates that $F_7 T_7$ and $F_8 T_8$ be of a sufficiently low magnitude. On the other hand, $F_7 T_7 + F_8 T_8$ must be high enough to fully cure the annular volume 65, or high enough to initiate a full cure of the annular volume 65 followed by heating to effectuate the full cure of the annular volume 65 if the radiation is accompanied with, or followed by, heating. For the case in which $F_7 T_7$ is equal to about $F_8 T_8$, the time-integrated radiant energy flux absorbed by the annular volume 65 (i.e., $2F_7 T_7$) is about twice the time-integrated radiant energy flux absorbed by the remaining volume 55 (i.e., $F_7 T_7$). Practical values of $F_7 T_7$ and $F_8 T_8$ that satisfy the preceding curing requirements can be determined without undue experimentation by parametric studies involving $F_7$, $T_7$, $F_8$, and $T_8$, as explained supra.

Figure 8:
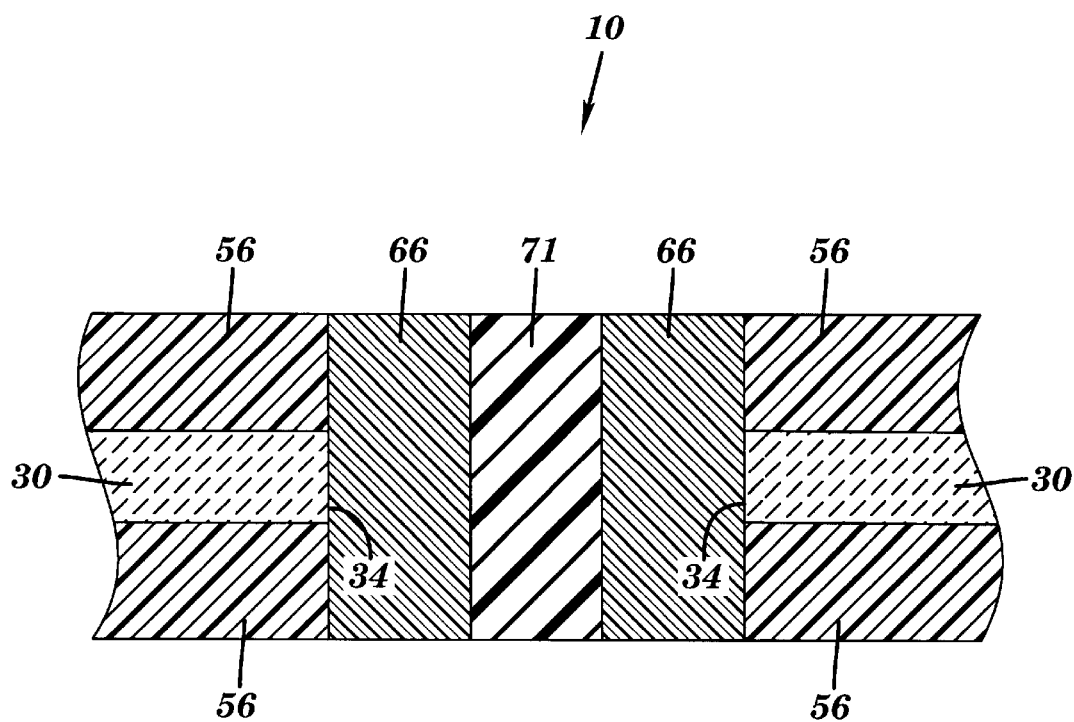
FIG. 8 depicts the layer of FIG. 7 after the photo lithographic masking and exposure shown in the third preferred embodiment of FIG. 7.

FIG. 8 shows the appearance of the layer 10 after execution of the photo lithographic masking and exposure for the third preferred embodiment of FIG. 7. The cylindrical volume 70 is represented as an uncured volume 71, the annular volume 65 has become a fully cured volume 66, and the remaining volume 55 has become a partially cured volume 56. The uncured volume 71 is a consequence of the opaque portions 402 and 412 of the masks 400 and 410, respectively. The uncured volume 71 in FIG. 8 may be chemically developed away to form a via in the same manner as the uncured volume 72 in FIG. 6 may be chemically developed away to form a via as was explained supra.

Figure 9:
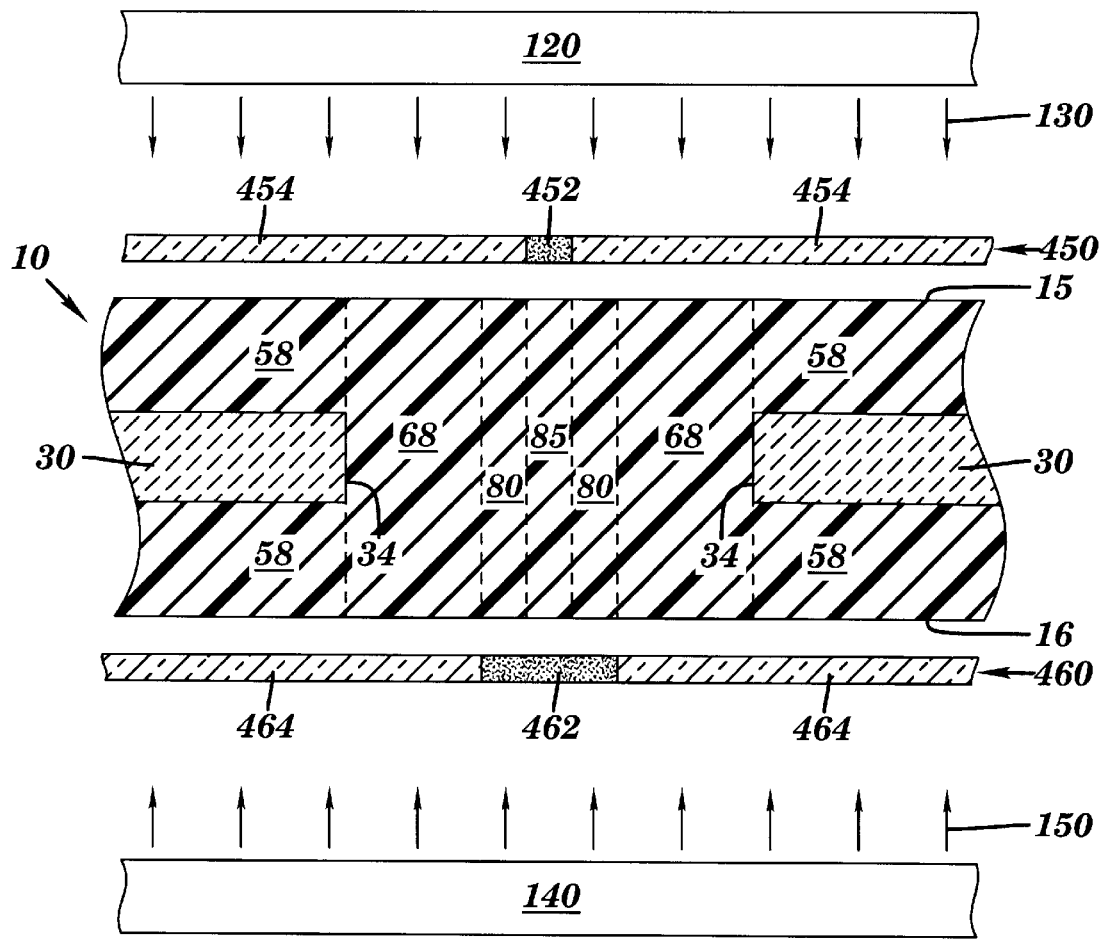
FIG. 9 depicts FIG. 2 with a modification of the volume structure and showing a photolithographic masking and exposure, in accordance with a fourth preferred embodiment of the present invention.

FIG. 9 illustrates FIG. 2 with a modification of the volume structure and showing a photolithographic masking and exposure, in accordance with a fourth preferred embodiment of the present invention. In FIG. 9, the portion 51 of the remaining volume 50 of FIG. 2 has been eliminated such that the remaining volume 50 has been replaced by the remaining volume 58, and an annular volume 68 has replaced the annular volume 60 of FIG. 2 such that the power plane 30 circumscribes the annular volume 68 at the cylindrical surface 34 of the power plane 30. Additionally, the cylindrical volume 70 of FIG. 2 has been replaced by a cylindrical volume 85 and an annular volume 80 circumscribing the cylindrical volume 85, such that the annular volume 68 circumscribes the annular volume 80. In FIG. 9, the radiation source 120 directs radiation 130 of energy flux $F_9$ for a time duration $T_9$, such as ultraviolet radiation, through a mask 450 located over the surface 15 of the layer 10 and then through the layer 10. In relation to the radiation 130, the mask 450 includes an opaque portion 452 over the cylindrical volume 85, and a transparent portion 454 over the annular volume 80, over the annular volume 68, and over the remaining volume 58.

Due to the presence of the power plane 30, the radiation 130 cannot access a portion of the remaining volume 58 situated between the power plane 30 and the surface 16 of the layer 10, so that the radiation source 140 must be used. The radiation source 140 directs radiation 150 of energy flux $F_{10}$ for a time duration $T_{10}$, such as ultraviolet radiation, through a mask 460 located over the surface 16 of the layer 10 and then through the layer 10. In relation to the radiation 150, the mask 460 includes an opaque portion 462 over the cylindrical volume 85 and over the annular volume 80, and a transparent portion 464 over the annular volume 68 and over the remaining volume 58. $F_9 T_9$ and $F_{10} T_{10}$ are preferentially about equal and should not differ by more than about 10%. The radiation source 120 may be operated before, after, or concurrent with the radiation source 140. Note that the power plane 30 must be present in the fourth embodiment. The energy absorbed by the remaining volume 58 from the radiation 130 and the radiation 150 should be bounded so to partially cure, but not fully cure, the remaining volume 58. This necessitates that $F_9 T_9$ and $F_{10} T_{10}$ be of a sufficiently low magnitude. On the other hand, $F_9 T_9 + F_{10} T_{10}$ must be high enough to fully cure the annular volume 68, or high enough to initiate a full cure of the annular volume 68 followed by heating to effectuate the full cure of the annular volume 68 if the radiation is accompanied with, or followed by, heating. Moreover, since the opaque portion 462 prevents the radiation 150 from reaching the annular volume 80, the annular volume 80 will be partially cured if the remaining volume 58 is partially cured. For the case in which $F_9 T_9$ is equal to about $F_{10} T_{10}$, the time-integrated radiant energy flux absorbed by the annular volume 68 (i.e., $2F_9 T_9$) is about twice the time-integrated radiant energy flux absorbed by the remaining volume 58 as well as by the annular volume 80 (i.e., $F_9 T_9$). Practical values of $F_9 T_9$ and $F_{10} T_{10}$ that satisfy the preceding curing requirements can be determined without undue experimentation by parametric studies involving $F_9$, $T_9$, $F_{10}$, and $T_{10}$ as explained supra.

Figure 10:
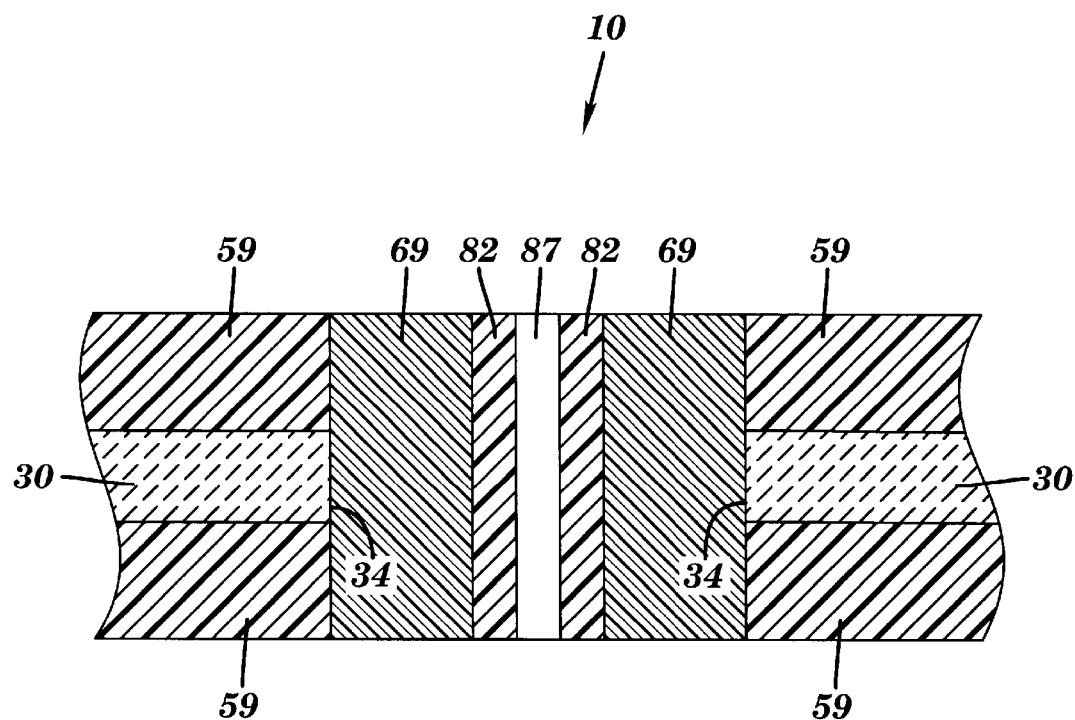
FIG. 10 depicts the layer of FIG. 9 after the photo lithographic masking and exposure shown in the fourth preferred embodiment of FIG. 9.

FIG. 10 shows the appearance of the layer 10 after execution of the photo lithographic masking and exposure for the fourth preferred embodiment of FIG. 9. The cylindrical volume 85 is represented as an uncured volume 87, the annular volume 80 has become a partially cured volume 82, the annular volume 68 has become a fully cured volume 69, and the remaining volume 58 has become a partially cured volume 59. The uncured volume 87 is a consequence of the overlapping portions of the opaque portions 452 and 462 of the masks 450 and 460, respectively. The uncured volume 87 in FIG. 10 may be chemically developed away to form a via in the same manner as the uncured volume 72 in FIG. 6 may be chemically developed away to form a via as was explained supra.

Note that a via thus formed in place of the uncured volume 87 is adjacent to the partially cured volume 82. Thus, during subsequent pressurization and/or elevated temperature, partially cured PID material may flow from the partially cured volume 82 into the via thus formed from the uncured volume 87. This is potentially advantageous in cases where a small crevice or space may develop between layers of a layered stack, such as the layered stack 999 described infra in conjunction with FIGS. 11 and 12, that includes the layer 10 of FIG. 10. The partially cured PID material that flows from the partially cured volume 82 into the via formed from the uncured volume 87 may advantageously fill the unwanted crevice or space between layers, which insulatively protects against electrical shorting that may occur between subsequent plating of the via and nearby conductive material located within the layered stack. Noting that the PID material within the via may cause subsequent metallic plating thickness variability, it is desirable to control the volume of the uncured volume 87 to be small enough to reduce any such plating thickness variability to levels that can be tolerated. Noting that the volume of the uncured volume 87 is proportional to the differential in cross-section area of the opaque portion 452 of the mask 450 and the opaque portion 462 of the mask 460, the volume of the uncured volume 87 may be controlled by adjusting the cross-section area of the portions 452 and 462. The cross-section area of the portion 452 is the area of the portion 452 that is exposed to the radiation 130. The cross-section area of the portion 462 is the area of the portion 462 that is exposed to the radiation 150.

FIG. 11 depicts FIG. 6 after the photolithographically masked and exposed layer 10 is sandwiched between a 2S/1P layer as 500 and a 2S/1P layer 600, to form a layered stack 999, wherein the uncured volume 72 of FIG. 6 has been chemically developed away and is replaced by a via 73 as shown in FIG. 11. A 2S/1P layer generally comprises a dielectric layer with an internal power layer, a signal layer on a bounding surface of the dielectric layer, and another signal layer on another bounding surface of the dielectric layer. A signal plane is a layer of conductive circuit lines. The 2S/1P layer 500 and the 2S/1P layer 600 may each comprise any dielectric material such as, inter alia, a PID material or a filled dielectric material containing a filler such as, inter alia, silica, alumina, dolomite, mica, and talc. The 2S/1P layer 500 includes a dielectric layer 510, a power plane 520, a signal plane 540, and a signal plane 550. Additionally, the 2S/1P layer 500 includes a via 530 that is registered over the via 73, wherein the via 530 includes a cross section of about the same size and shape as a cross section of the via 73. As shown, the dielectric layer 510 includes a fully cured material, wherein the dielectric layer 510 could include a drilled hole with or without metal plating. Alternatively, the dielectric layer 510 could include a fully cured ring of dielectric material (analogous to the fully cured volume 62) surrounding the via 530 and a partially cured volume of dielectric material (analogous to the partially cured volume 52) circumscribing the fully cured ring. The 2S/1P layer 600 includes a dielectric layer 610, a power plane 620, a signal plane 640, and a signal plane 650. Additionally, the 2S/1P layer 600 includes a via 630 that is registered over the via 73, wherein the via 630 includes a cross section of about the same size and shape as a cross section of the via 73. As shown, the dielectric layer 610 includes a fully cured material, wherein the dielectric layer 610 could include a drilled hole with or without metal plating. Alternatively, the dielectric layer 610 could include a fully cured ring of dielectric material (analogous to the fully cured volume 62) surrounding the via 630 and a partially cured volume of dielectric material (analogous to the partially cured volume 52) circumscribing the fully cured ring. FIG. 11 shows a through hole 940 that includes the sequential arrangement of the via 530, the via 73, and the via 630. The partially cured volume 52 of the layer 10 will become fully cured upon subsequent pressurization and/or elevated temperature, which will cause both the 2S/1P layer 500 and the 2S/1P layer 600 to become adhesively bonded to the layer 10. During the subsequent final lamination step of pressurization and/or elevated temperature, the fully cured volume 62 will prevent liquified PID material from the partially cured volume 52 from flowing into the via 73, the fully cured ring (if it exists) of dielectric material in the dielectric layer 510 will prevent liquified PID material from the circumscribing partially cured volume of dielectric material in the dielectric layer 610 from flowing into the via 530, and the fully cured ring (if it exists) of dielectric material in the dielectric layer 610 it will prevent liquified PID material from the circumscribing partially cured volume of dielectric material in the dielectric layer 610 from flowing into the via 630. The layer 10 is called a "sticker layer," because the layer 10 serves to interfacially bond the 2S/1P layer 500 and the 2S/1P layer 600 together in conjunction with the final lamination step of pressurization and/or elevated temperature.

Figure 12:
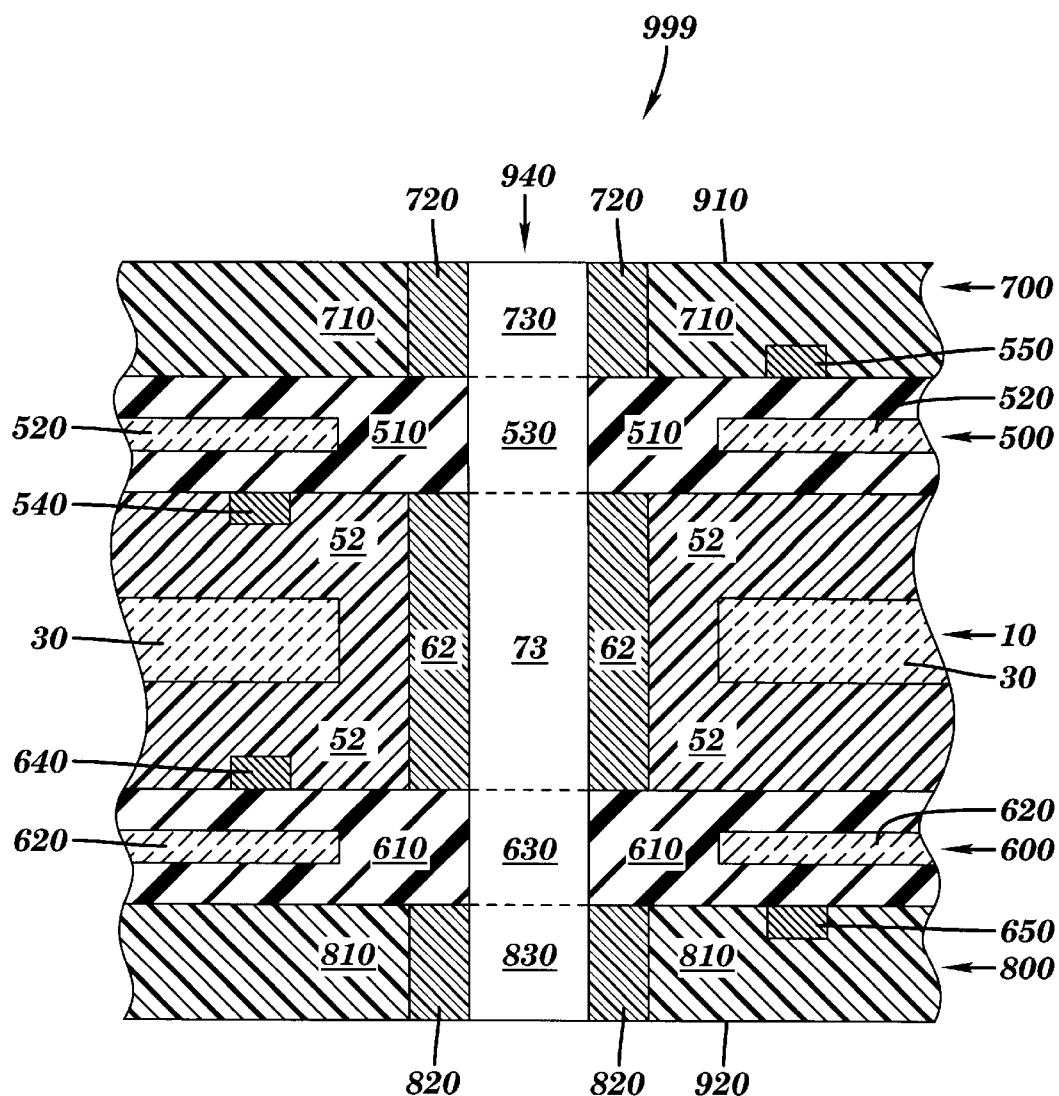
FIG. 12 depicts FIG. 11 after additional layers having PID material are added to opposite sides of the layered stack.

FIG. 12 depicts FIG. 11 after additional layers 700 and 800 are added to opposite sides of the layered stack 999 prior to the final lamination step of pressurization and/or elevated temperature. The layer 700 is stacked on the 2S/1P layer 500 and includes a partially cured volume 710 of PID material, a via 730 that is registered over the via 530 wherein the via 730 includes a cross section of about the same size and shape as a cross section of the via 73, and a fully cured volume 720 of PID material that circumscribes the via 730. The layer 800 is stacked on the 2S/1P layer 600 and includes a partially cured volume 810 of PID material, a via 830 that is registered over the via 630 wherein the via 830 includes a cross section of about the same size and shape as a cross section of the via 73, and a fully cured volume 820 of PID material that circumscribes the via 830. FIG. 12 shows the through hole 940 as an elongated variant of the through hole 940 in FIG. 11 such that the through hole 940 of FIG. 12 includes the sequential arrangement of the via 730, the via 530, the via 73, the via 630, and the via 830. The partially cured volumes 710, 810, and 52, along with any partially cured volumes that may exist in the 2S/1P layers 500 and 600, will become fully cured upon a subsequent final lamination step of pressurization and/or elevated temperature. The final lamination step which will cause the layers 700 and 800 to respectively bond adhesively with the 2S/1P layers 500 and 600, in addition to causing the 2S/1P layers 500 and 600 to each bond adhesively with the layer 10. During the subsequent final lamination step of pressurization and/or elevated temperature, the fully cured volume 720 will prevent liquified PID material from the partially cured volume 710 from flowing into the via 730, the fully cured volume 820 will prevent liquified PID material from the partially cured volume 810 from-flowing into the via 830, the fully cured volume 62 will prevent liquified PID material from the partially cured volume 52 from flowing into the via 73, the fully cured ring (if it exists) of dielectric material in the dielectric layer 510 will prevent liquified PID material from the circumscribing partially cured volume of dielectric material in the dielectric layer 610 from flowing into the via 530, and the fully cured ring (if it exists) of dielectric material in the dielectric layer 610 it will prevent liquified PID material from the circumscribing partially cured volume of dielectric material in the dielectric layer 610 from flowing into the via 630. While FIG. 12 depicts a five-layer structure, the invention embodied by FIG. 12 could include any number of layer, such as 17 or more layers, wherein all layers each include a partially cured ring of dielectric material or alternating layers each include a partially cured ring of dielectric material.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising a layer that includes:
    a cylindrical volume;
    a fully cured annular volume of a photoimageable dielectric (PID) material circumscribing the cylindrical volume; and
    a partially cured remaining volume of the PID material circumscribing the annular volume.

2. The electronic structure of claim 1, wherein the cylindrical volume includes the PID material in an uncured state.

3. The electronic structure of claim 1, wherein the cylindrical volume includes a via.

4. The electronic structure of claim 3, further comprising a dielectric layer on the layer of PID material, wherein the dielectric layer includes a first via registered over the via, wherein a cross-sectional area and shape of the first via is about equal to a cross-sectional area and shape of the via.

5. The electronic structure of claim 1, wherein the cylindrical volume includes a via and a first partially cured volume of the PID material circumscribing the via, and wherein the fully cured annular volume of the PID material circumscribes the first partially cured volume.

6. An electronic structure, comprising:
    a layer that includes: a via, a fully cured volume of a photoimageable dielectric (PID) material circumscribing the via, and a partially cured remaining volume of the PID material circumscribing the fully cured volume; and
    a power plane between a first surface of the layer and a second surface of the layer, wherein the power plane includes a hole therethrough, wherein a perimeter of the hole in the power plane surrounds the fully cured volume and circumscribes a portion of the remaining volume.

7. The electronic structure of claim 6, further comprising:
    a first substructure formed on the first surface of the layer, wherein the first substructure includes a first dielectric layer having a first via registered over the via, wherein a cross-sectional area and shape of the first via is about the same as a cross-sectional area and shape of the via, wherein a first signal plane of the first substructure is on a first surface of the first dielectric layer, wherein a second signal plane of the first substructure is on a second surface of the first dielectric layer, wherein the first dielectric layer includes a first power plane having a therethrough, and wherein the hole of the first power plane surrounds the first via; and
    a second substructure formed on the second surface of the layer, wherein the second substructure includes a second dielectric layer having a second via registered over the via, wherein a cross-sectional area and shape of the second via is about the same as a cross-sectional area and shape of the via, wherein a first signal plane of the second substructure is on a first surface of the second dielectric layer, wherein a second signal plane of the second substructure is on a second surface of the second dielectric layer, wherein the second dielectric layer includes a second power plane having a therethrough, and wherein the hole of the second power plane surrounds the second via.

8. The electronic structure of claim 7, wherein the first dielectric layer includes a first fully cured PID material, and wherein the second dielectric layer includes a second fully cured PID material.

9. The electronic structure of claim 7, further comprising:
    a first layer having a first PID material and formed on the first substructure, wherein the first layer includes: a third via registered over the first via wherein a cross-sectional area and shape of the third via is about the same as a cross-sectional area and shape of the first via, a first fully cured volume circumscribing the third via, and a first partially cured remaining volume circumscribing the first fully cured volume; and
    a second layer having a second PID material and formed on the second substructure, wherein the second layer includes: a fourth via registered over the second via wherein a cross-sectional area and shape of the fourth via is about the same as a cross-sectional area and shape of the second via, a second fully cured volume circumscribing the fourth via, and a first partially cured remaining volume circumscribing the second fully cured volume, and wherein the through further includes the third via and the fourth via.

10. An electronic structure, comprising:
    a layer that includes: a via, a first partially cured volume of a photoimageable dielectric (PID) material circumscribing the via, a fully cured volume of the PID material circumscribing the first partially cured volume, and a second partially cured remaining volume of the PID material circumscribing the fully cured volume; and
    a power plane between a first surface of the layer and a second surface of the layer, wherein the power plane includes a hole therethrough, wherein a perimeter of the hole in the power plane circumscribes the fully cured volume.

11. An electronic structure, comprising:
    a layer that includes: a cylindrical volume, a fully cured volume of a photoimageable dielectric (PID) material circumscribing the cylindrical volume, and a partially cured remaining volume of the PID material circumscribing the fully cured volume; and
    a power plane between a first surface of the layer and a second surface of the layer, wherein the power plane includes a hole therethrough, wherein a perimeter of the hole in the power plane surrounds the fully cured volume and circumscribes a portion of the remaining volume.

* * * * *